United States Patent

[11] 3,573,497

[72] Inventor Albert V. Kraybill
Riverside, Ill.

[21] Appl. No. 866,130
[22] Filed Oct. 9, 1969
Continuation of Ser. No. 576,479, Aug. 31, 1966, abandoned
[45] Patented Apr. 6, 1971
[73] Assignee Motorola, Inc.
Franklin Park, Ill.

[54] BIASING CIRCUIT
10 Claims, 4 Drawing Figs.

[52] U.S. Cl. .......... 307/237, 325/319, 325/347, 325/402, 325/473
[51] Int. Cl. .......... H03k 5/08, H04b 1/16
[50] Field of Search .......... 325/318, 319, 402, 410; 307/237

[56] References Cited
UNITED STATES PATENTS

| | | | |
|---|---|---|---|
| 2,457,207 | 12/1948 | Carlson | 325/347 |
| 2,485,731 | 11/1949 | Gruen | 325/347 |
| 2,858,424 | 10/1958 | Stern et al. | 325/319 |
| 2,862,046 | 11/1958 | Relis | 330/173 |
| 2,885,498 | 5/1959 | Bruck et al. | 307/237 |
| 2,929,998 | 3/1960 | Diehl | 330/29 |
| 3,018,444 | 1/1962 | Offner | 330/29 |
| 3,193,767 | 7/1965 | Schultz | 325/410 |
| 3,344,355 | 9/1967 | Massman | 325/410 |
| 3,430,154 | 2/1969 | Harwood | 330/19 |

*Primary Examiner*—Donald D. Forrer
*Assistant Examiner*—Harold A. Dixon

ABSTRACT: Limiting amplifier adapted to be constructed in integrated circuit form and including plurality of direct current coupled transistor stages with input and output circuits interconnected therewith. The amplifier has sufficient gain to limit on noise so that a rectangular wave output signal is developed at the output circuit. An integrating network responsive to the output signal provides a bias voltage which is coupled to the input circuit to control the bias applied to the semiconductor devices so that the duty cycle of the rectangular wave output signal is regulated to be preferably a 50 percent duty cycle.

INVENTOR
ALBERT V. KRAYBILL.
BY
Mueller, Aichele & Rauner
ATTYS.

Patented April 6, 1971 3,573,497

2 Sheets-Sheet 2

INVENTOR
ALBERT V. KRAYBILL

BY

Mueller, Aichele & Rauner

ATTYS.

BIASING CIRCUIT

This application is a continuation of U.S. Pat. application Ser. No. 576,479 filed Aug. 31, 1966, now abandoned.

This invention relates to a direct current coupled amplifier and in particular to the stabilization of such an amplifier used as a limiter.

In designing amplifiers which are to be manufactured as an integrated circuit, it is desirable to use direct current coupling as it is difficult to manufacture integrated circuits using internal capacitive coupling. However, the use of direct current coupling causes circuit stabilization problems as the drift of the direct current voltage level causes the circuits to malfunction. Amplifiers in which none of the stages limit during operation, as for example linear amplifiers, are customarily stabilized by stabilizing the direct current bias voltage at the input stage of the amplifier.

However, if any of the stages of an amplifier circuit limit, and in particular in limiters used in frequency modulation systems where the amplifier is designed to limit on noise, stabilization of the input voltage level in this manner can lead to a degradation in the operation of the amplifier. In this type of amplifier the gain is sufficiently high that the output stage switches between saturation and nonconduction in response to the noise generated at the input stage of the amplifier. The normal desired output of such a limiter amplifier in response to a frequency modulated wave is a rectangular wave having a 50 percent duty cycle. If, for example, the direct current bias voltage at the input stage is stabilized, a change in the gain of the following stages by small amount may cause the output stage of the amplifier to be permanently switched to either saturation or nonconduction, thus reducing the sensitivity of the receiver.

Accordingly it is an object of this invention to provide an improved bias stabilization circuit for a limiter amplifier.

Another object of this invention is to provide a bias stabilization circuit for a limiter amplifier wherein the duty cycle of the output signal is maintained at 50 percent.

A feature of this invention is the provision of a bias stabilization circuit for a limiter amplifier wherein the output of the limiter amplifier is integrated to develop a bias control voltage which is applied to the input stage of the amplifier.

Another feature of this invention is the provision of a bias stabilization circuit for a limiter amplifier wherein the output signal is switched between two voltage levels chosen so that the output signal of the limiter amplifier is a rectangular wave having a 50 percent duty cycle.

The invention is illustrated in the drawings in which.

In practicing this invention an amplifier for a frequency modulated intermediate frequency signal is provided which limits on noise and which produces a rectangular output signal having a predetermined duty cycle which it is desired to stabilize. The output signal of the limiter amplifier is integrated to develop a bias voltage and this bias voltage is applied to the input stage of the limiter amplifier to regulate the duty cycle of the output signal. If the duty cycle of the output signal changes, the bias voltage is changed to bring the duty cycle back to the predetermined level. In normal operation the time constants of the charging and discharging paths of the integrating network and the voltage levels of the output signal are chosen so as to maintain a 50 percent duty cycle for the output signal. To facilitate construction of the amplifier as an integrated circuit, the semiconductor devices (transistors) forming the amplifier are of the same conductivity type, and are direct current coupled.

Figure 1:
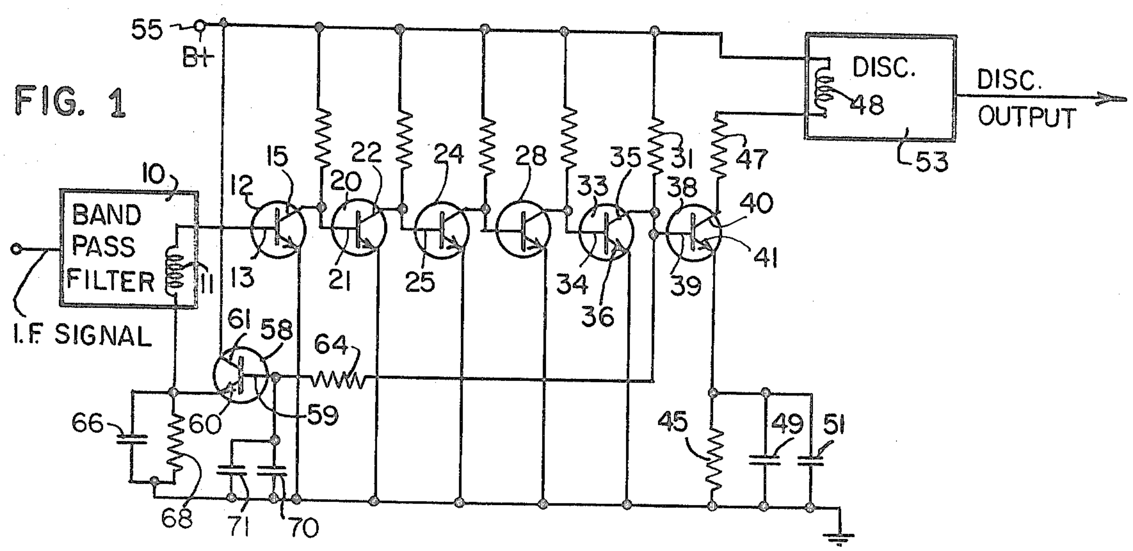
FIG. 1 is a partial schematic and partial block diagram of a limiter amplifier incorporating the bias stabilization circuit of this invention.

In FIG. 1 there is shown an IF limiter amplifier incorporating the features of this invention which is suitable for use in a frequency modulation superheterodyne receiver. An IF signal is received by band pass filter 10 and coupled by coil 11 to base 13 of transistor 12. An output signal is developed at collector 15 and coupled to base 21 of transistor 20. The output signal developed at collector 22 is coupled to base 25 of transistor 24 and this is repeated through transistors 28 and 33. In a limiter amplifier, as shown in FIG. 1, sufficient gain is provided so that the limiter will limit on noise. That is, the noise of the first amplifier stage, transistor 12, is amplified so that transistor 33 switches between saturation and nonconduction to develop a rectangular output signal on collector 35.

The output signal appearing on collector 35 of transistor 33 is coupled to base 39 of transistor 38. This signal is amplified by transistor 38 and coupled from collector 40 to discriminator 53 through resistor 47. Emitter 36 of transistor 33 is coupled to a first reference potential so that with transistor 33 saturated, collector 35 is clamped essentially at the first reference potential and transistor 38 is biased to nonconduction. With transistor 33 biased to nonconduction the B+ potential from terminal 55 is coupled through resistor 31 to base 39 biasing transistor 38 to conduction. With transistor 38 conducting current flows from terminal 55 through discriminator coil 48 resistor 47 transistor collector 40 and emitter 41 of transistor 38 and resistor 45 to the first reference potential. This flow of current establishes a fixed potential on emitter 41 thereby clamping base 39 of transistor 38 at a second reference potential. The values of resistors 45 and 47 are chosen so as to clamp base 39 at a predetermined desired level. The criteria for establishing this level will be discussed in a subsequent portion of this specification. Capacitors 49 and 51 are bypass capacitors for resistor 45.

In order to develop a bias potential for input transistor 12 of the limiter amplifier circuit, an integrating network consisting of capacitor 70 and resistance 64 is coupled to base 39 of transistor 38. Capacitor 71 coupled in parallel with capacitor 70 is very much smaller than capacitor 70 and acts as a high frequency bypass capacitor to eliminate regeneration. In operation the rectangular wave appearing at base 39 of transistor 38 is applied to the integrating network to develop a bias potential which is applied to base 59 of transistor 58. The magnitude of this bias potential is determined by the magnitude of the first and second reference potentials and the time constant of the charging and discharging paths of the integrating network. In the circuit shown in FIG. 1 the charging path and the discharging path are the same so that the magnitude of the bias potential is determined only by the magnitude of the first and second reference potentials.

Emitter 60 of transistor 58 is coupled to the first reference potential through resistor 68 and collector 61 is coupled to the B+ terminal 55. Capacitor 66 is a bypass capacitor used to place one end of coil 11 at AC ground. A bias control signal applied to base 59 of transistor 58 is amplified and appears on emitter 60. The bias control signal appearing on emitter 60 is coupled to base 13 of transistor 12 through the band pass filter coil 11.

In operation assume that the rectangular output signal appearing on base 39 of transistor 38 has a 50 percent duty cycle and the first and second reference potentials have been properly chosen. The bias control signal developed by the integrating network 64, 70 is a measure of the duty cycle of the output signal, and is applied to base 13 of transistor 12 and acts to maintain the proper bias level for a 50 percent duty cycle. If the duty cycle increases so that the duty cycle is greater than 50 percent the bias control signal developed on base 59 of transistor 58 will increase. This increase in the bias control signal applied to base 13 of transistor 12 will change the operation of the limiter amplifier so as to decrease the duty cycle of the output signal. If the duty cycle were to decrease so that the duty cycle is less than 50 percent, the bias control signal potential will also decrease and will act to bias transistor 12 so that the duty cycle will be increased. Thus the integrating network acts to establish a proper bias voltage on base 13 of transistor 12 to maintain the desire duty cycle.

In designing the circuit the values of the first and second reference potentials are chosen so as to provide the proper bias for a 50 percent duty cycle. For example assume that bias potential applied to base 13 of transistor 12 for 50 percent duty cycle operation is +0.7 volts. The voltage drop, $V_{BE}$, from base 59 to emitter 60 of transistor 58 is approximately 0.7 volts for a silicon transistor, so that the required voltage on base 59 from integrator 64, 70 is +1.4 volts. Since the time constant of the charging and discharging paths of integrating network 64, 70 are equal, for a 50 percent duty cycle signal the rectangular output signal applied to the integrating network must have a peak value twice the bias control signal value or +2.8 volts. In other words, the integrating network averages the output signal to provide a bias control signal which is a measure of the duty cycle. Thus the values of resistors 47 and 45 must be selected so as to give a value on emitter 41 on transistor 38 of 2.1 volts. With a $V_{BE}$ from base 39 from emitter 41 of +0.7 volts this will produce a voltage on base 39 of +2.8 volts which is the required voltage. Changing the first or second reference potentials which appear at base 39 of transistor 38 during the switching operation will change the duty cycle of the output signal. Also if the relative time constant of the charging and the discharging paths for the integrating network 64, 70 is changed, the duty cycle of the output signal will be changed. Thus the duty cycle of the output signal can be varied as required. However, in normal operation as a limiter amplifier, the desired duty cycle is 50 percent and the parameters are selected accordingly. The values of resistors 45 and 47 are adjusted to provide the required potentials to establish a 50 percent duty cycle for the output signal.

The load presented to transistor 38 is resistance 47 and inductance 48. When the desired rectangular wave is applied to transistor 38 and average current determined by the value of the square wave voltage and the load impedance will flow in transistor 38 and resistor 45. The value of resistor 45 must be determined so that this average current produces 2.1 volts drop across resistance 45, thus establishing the proper reference voltage at this point.

Figure 2:
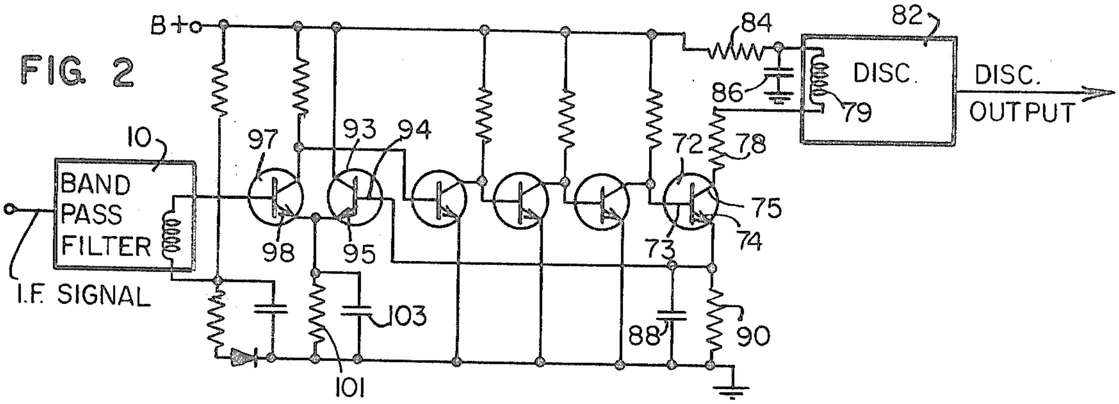
FIG. 2 is a drawing of a second embodiment of the stabilization circuit of this invention.

In FIG. 2 there is shown another embodiment of this invention. In this embodiment output transistor 72 has a load consisting of resistor 78 and discriminator coil 79. Capacitor 86 and resistor 84 form a filter network for the direct current supply. With a rectangular wave applied to base 73 of transistor 72, transistor 72 is biased on and a current flows through the collector 75 and emitter 74 to charge capacitor 88. The value of this charging current is determined by the load consisting of resistor 78 and coil 79 and thus transistor 72 together with its load and capacitor 88 form the integrating network. With transistor 72 biased to nonconduction by the rectangular wave applied to base 73, capacitor 88 discharges through resistor 90. Thus the integrating circuit consists of capacitor 88, resistor 90, and transistor 72 and its load, resistor 78 and coil 79. The integrated output potential from capacitor 88 is applied to base 94 of transistor 93. Transistors 93 and 97 form a differential amplifier having emitters 95 and 98 coupled to a common impedance resistance 101. Capacitor 103 acts as an alternating current bypass for resistor 101 to prevent degeneration in the differential amplifier. The direct current potential on capacitor 88 is applied to base 94 of transistor 93 and regulates the flow of current through transistor 93 and resistance 101. This in turn determines potential on emitters 95 and 98 which determines the input bias potential for transistor 97. Changes in the duty cycle of the output rectangular wave will therefore produce changes in the bias potential applied to the input of transistor 97 so that the rectangular wave output voltage is regulated to the desired duty cycle.

Figure 3:
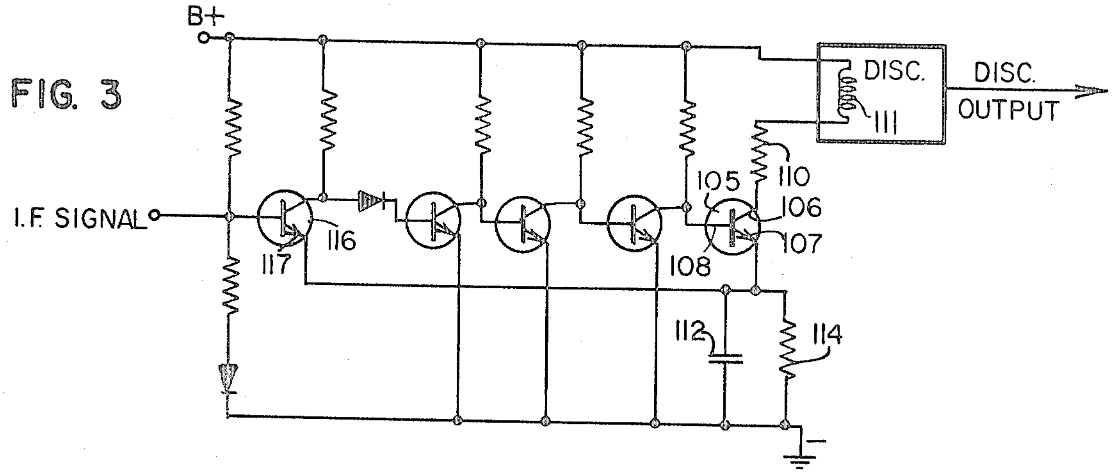
FIG. 3 is a drawing of a third embodiment of the stabilization circuit of this invention.

Another embodiment of this invention is shown in FIG. 3. The integrating system of FIG. 3 operates in a manner similar to that shown in FIG. 2. The load for transistor 105, the output transistor is resistance 110 and discriminator coil 111 which are coupled to collector 106. With a rectangular wave applied to base 108 of transistor 105, biasing the transistor alternately to conduction, and nonconduction, the flow of current through transistor 105, determined by resistor 110 and discriminator coil 111 act to charge capacitor 112 and to develop a potential across resistance 114. During the period of time that the rectangular wave applied to base 108 of transistor 105 biases the transistor to nonconduction, capacitor 112 discharges through resistance 114. The resulting bias potential developed at capacitor 112 is coupled to emitter 117 of transistor 116 to bias this transistor. Changes in the duty cycle of the rectangular wave applied to base 108 of transistor 105, change the bias potential produced at capacitance 112 and thus the bias potential on emitter 117 of transistor 116. THese changes act to regulate the duty cycle of the rectangular wave output voltage to the desired duty cycle.

Figure 4:
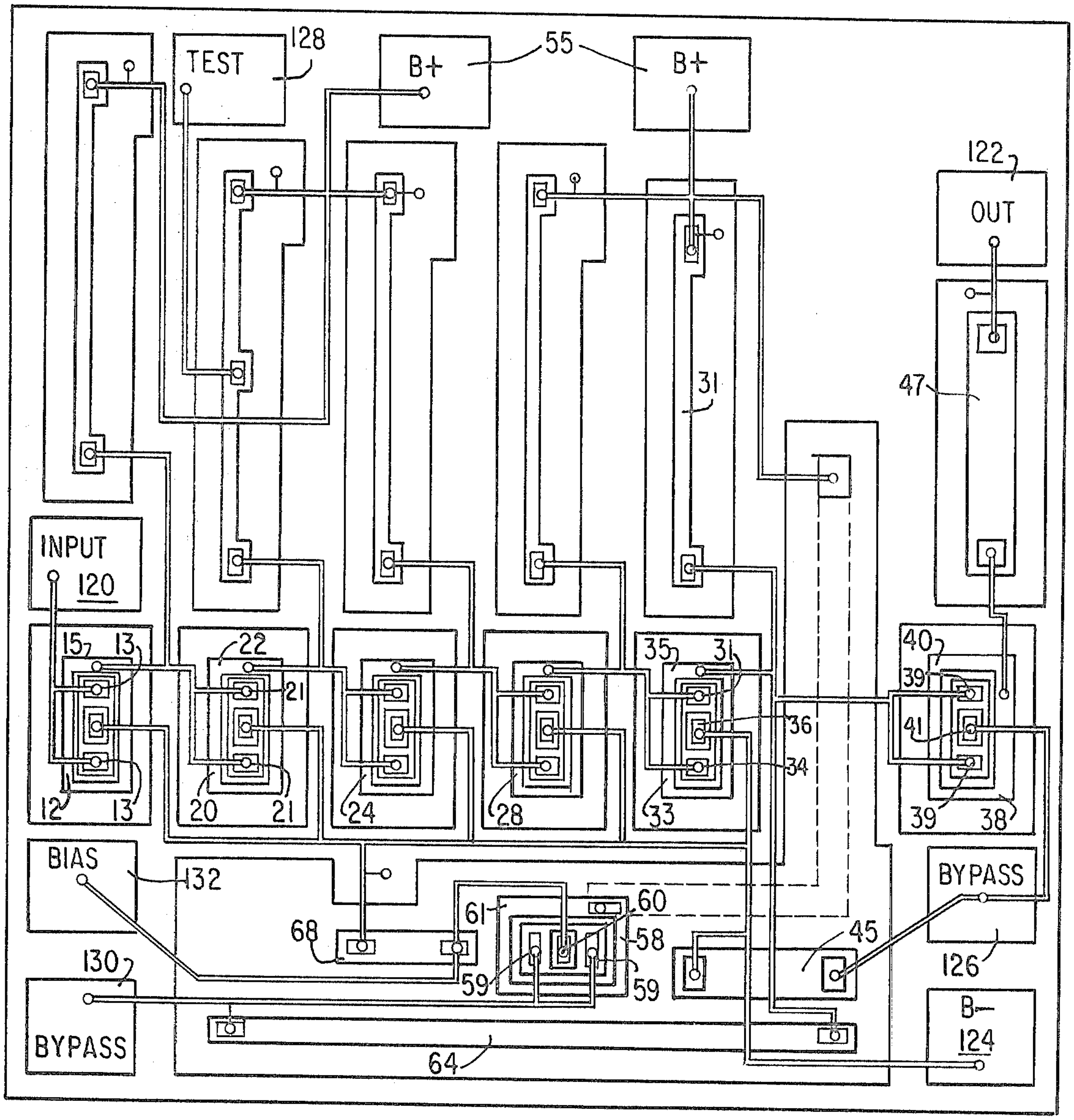
FIG. 4 is a drawing of an integrated circuit ship showing the structural layout of the circuit of FIG. 1 in an integrated form.

The circuits of this invention are especially adapted to be manufactured in an integrated circuit form. FIG. 4 illustrates an integrated circuit semiconductor chip incorporating the circuit shown in FIG. 1. The portions of the chip which correspond to the circuit elements of FIG. 1 have the same reference numerals. As shown in FIG. 1, all of the transistors are of the same conductivity type. The input signal is coupled from coil 11 of band pass filter 10 to input pad 120. A B+ supply voltage is supplied to pads 55. Pad 128 is a test pad to provide a test point for the circuit. The output signal is taken from pad 122 and coupled to the discriminator coil 48 of discriminator 53. The ground potential is applied to pad 124. Bypass capacitors 49 and 51 for resistance 45 are coupled to pad 126. Integrating capacitor 70 and bypass capacitor 71 are coupled to pad 130 and bypass capacitor 66 is connected to pad 132. The integrated circuit chip illustrated in FIG. 4 is approximately 50 mils square.

I claim:

1. An amplifier circuit for use in a frequency modulated receiver to amplify and limit the frequency modulated intermediate frequency wave thereof, including in combination, a direct current coupled amplifier having a plurality of transistors and direct current coupling means interconnecting said transistors in cascade, output circuit means direct current coupled to the last one of said transistors, input circuit means for receiving the intermediate frequency wave direct current coupled to the initial one of said transistors, said direct current coupled amplifier having sufficient gain that the noise of said initial one of said transistors causes said last one of said transistors to be driven between saturation and nonconduction thereby, said intermediate frequency wave coupled to said initial one of said transistors causing said last one of said transistors to be driven between saturation and nonconduction on opposite half cycles producing a rectangular wave frequency modulated output signal at said output circuit means, said output circuit means including an integrating network responsive to said rectangular wave output signal to integrate the same to thereby develop a bias control voltage which varies with the average of the output signal and is a measure of the duty cycle of said rectangular wave output signal, and bias stabilizing feedback circuit means coupling said integrating network to said input circuit means, said feedback circuit means being responsive to said bias control voltage to apply a bias voltage to said input circuit which controls the bias voltages applied to all said direct current coupled transistors so that the duty cycle of said rectangular wave frequency modulated output signal is regulated and held substantially constant.

2. The amplifier circuit of claim 1 wherein said output circuit means includes a first transistor having a base electrode adapted to receive said rectangular wave output signal and emitter and collector electrodes, first impedance means coupling said collector electrode of said first transistor to a first potential, resistance means and capacitance means coupled in parallel between said emitter electrode of said first transistor and a second potential, said capacitance means, said first transistor and said first impedance means forming said integrating network, said input circuit means including second and third transistors forming a differential amplifier and having emitter electrodes coupled together and base electrodes, second impedance means coupling said emitter electrodes of said second and third transistors to said second potential, said base electrode of said second transistor being adapted to receive and input signal, and said feedback circuit means coupling said capacitance means to said base electrode of said third transistor.

3. The amplifier circuit of claim 1 wherein said output circuit means includes a first transistor having a base electrode adapted to receive said rectangular wave output signal and emitter and collector electrodes, impedance means coupling said collector electrode of said first transistor to a first potential, resistance means and capacitance means coupled in parallel between said emitter electrode of said first transistor and a second potential, said capacitance means, said first transistor and said impedance means forming said integrating network, said input circuit means including a second transistor having a base electrode adapted to receive an input signal and an emitter electrode, and said feedback circuit means coupling said capacitance means to said emitter electrode of said second transistor.

4. Amplifier circuit means for a frequency modulated wave including in combination, a limiter amplifier having a plurality of amplifier stages each including a transistor, with an input transistor, a first output transistor and a plurality of intermediate transistors, and direct current coupling means interconnecting said transistors in cascade, said limiter amplifier having sufficient gain that said first output transistor is driven between nonconduction and saturation on alternate half cycles of the frequency modulated wave thereby producing a rectangular wave output signal at said first output transistor, and bias stabilizing feedback circuit means including an integrating network having first resistance means coupled to said first output transistor and capacitor means coupled between said first resistance means and a first potential, said first output transistor being alternately switched between nonconduction and saturation to cause said capacitor means to be alternately charged and discharged through said first resistance means, whereby a bias signal is developed across said capacitor means which varies with the average value of the output signal and is a measure of the duty cycle of the rectangular wave frequency modulated output signal, said feedback circuit means including first circuit means direct current coupling the junction of said first resistance means and said capacitor means to said input transistor, said input transistor being responsive to said bias signal and acting to control the bias voltages applied to the successive transistor amplifier stages to regulate the duty cycle of said rectangular wave output signal.

5. The amplifier circuit means of claim 4 wherein, said first output transistor includes an emitter electrode coupled to said first potential and a collector electrode, a second output transistor having a base electrode coupled to said collector electrode of said first output transistor and an emitter electrode, second resistance means coupling said emitter electrode of said second output transistor to said first potential, said first output transistor acting in said saturated state to establish said collector electrode of said first output transistor at substantially said first potential, said second output transistor being responsive to said first output transistor in said nonconductive state to become conductive and thereby clamp said collector of said first output transistor at a second potential, said first resistance means being coupled to said collector electrode of said first output transistor whereby said integrating network receives said first and second potentials for integrating the same to develop said bias signal.

6. The amplifier circuit means of claim 5 wherein said first circuit means includes emitter follower means and filter means coupling said junction of said first resistance means and said capacitance means to said input transistor means for applying said bias signal thereto.

7. An amplifier circuit for use with a high frequency alternating current wave including in combination, a direct current coupled amplifier constructed as an integrated circuit on a single semiconductor chip and having a plurality of semiconductor stages and direct current coupling means connecting said stages in cascade, said amplifier circuit including output circuit means and input circuit means, said direct current coupled amplifier having sufficient gain that said last one of said semiconductor stages is driven between saturation and nonconduction on alternate half cycles thereby producing a high frequency rectangular wave output signal at said output circuit means, and bias stabilizing feedback circuit means on said semiconductor chip including an integrating network, first circuit means direct current coupling said integrating network to said output circuit means, said integrating network being responsive to said rectangular wave output signal to develop therefrom a bias voltage which varies with the average value of said output signal and is a measure of the duty cycle thereof, said feedback circuit means including second circuit means coupling said integrating network to said input circuit means for applying a bias voltage thereto, said input circuit being direct current coupled to said amplifier to control the bias voltages applied to all said direct current coupled semiconductor stages, said feedback circuit means controlling the bias voltage applied to said input circuit means in response to said output signal so that the duty cycle of said rectangular wave output signal is regulated and held substantially constant.

8. The direct current amplifier circuit of claim 7 wherein said semiconductor stages include transistors all of which are of the same conductivity type.

9. The amplifier circuit of claim 7 wherein each of said semiconductor stages includes a transistor and said last one of said semiconductor stages includes a first output transistor, and said output circuit means includes a second output transistor coupled to said first output transistor and to said first circuit means, said first and second output transistors being alternately switched between nonconduction and saturation with one of said transistors being conductive as the other of said transistor is nonconductive, said first and second output transistors acting to alternately establish said first circuit means at first and second potentials, said integrating network being responsive to said first and second potentials to develop said bias voltage.

10. The amplifier circuit of claim 9 wherein said first and second potentials are chosen to establish said duty cycle at substantially 50 percent.